United States Patent [19]

O'Loughlin

[11] Patent Number: 5,705,959

[45] Date of Patent: Jan. 6, 1998

[54] HIGH EFFICIENCY LOW DISTORTION AMPLIFICATION

[75] Inventor: James P. O'Loughlin, Placitas, N. Mex.

[73] Assignee: The United States of America as represented by the Secretary of the Air Force, Washington, D.C.

[21] Appl. No.: 734,615

[22] Filed: Oct. 8, 1996

[51] Int. Cl.⁶ .................................................. H03C 5/00
[52] U.S. Cl. .......................................... 332/151; 332/120
[58] Field of Search ........................ 332/108, 119–122, 332/151–154; 330/10; 455/42, 47

[56] References Cited

U.S. PATENT DOCUMENTS

| | | | |
|---|---|---|---|
| 4,176,319 | 11/1979 | Kahn | 325/138 |
| 4,433,312 | 2/1984 | Kahn | 332/22 |
| 4,987,385 | 1/1991 | Engelmann | 330/297 |
| 5,103,189 | 4/1992 | Camiade et al. | 330/277 |
| 5,264,807 | 11/1993 | Okubo et al. | 330/295 |
| 5,319,315 | 6/1994 | Belcher | 330/51 |
| 5,329,249 | 7/1994 | Cripps | 330/302 |
| 5,469,127 | 11/1995 | Hulick et al. | 332/149 |
| 5,602,868 | 2/1997 | Wilson | 375/219 |

*Primary Examiner*—David Mis
*Attorney, Agent, or Firm*—William C. Auton

[57] ABSTRACT

A system and method is disclosed that provides a means for the high efficiency low distortion amplification of complex modulated radio frequency signals, such as but not limited to Single Side Band (SSB) signals. The innovative principle of the invention is based on the simultaneous amplitude and phase or angle modulation of Class "C" amplifier. Complex signals such as SSB signals can be described as a combination of amplitude and phase or angle modulation. By determining the amplitude and phase or angle components of the complex signal and using these to modulate a Class "C" amplifier, according to the manner prescribed in the invention, the objective of high efficiency low distortion is achieved. Previously, Class "B" amplifiers were required to amplify complex RF signals. The maximum efficiency of a Class "B" amplifier typically achieved in practice is about 40 percent compared to about 85 percent for Class "C" amplifiers. This increase in efficiency is very significant when applied to transmitters operating from batteries, solar cells, or other limited power sources in terms of size, weight, operating time and system cost.

20 Claims, 4 Drawing Sheets

HIGH EFFICIENCY LOW DISTORTION AMPLIFICATION

STATEMENT OF GOVERNMENT INTEREST

The invention described herein may be manufactured and used by or for the Government for governmental purposes without the payment of any royalty thereon.

BACKGROUND OF THE INVENTION

This invention relates to the amplification of complex modulated signals, and more particularly to their amplification with high efficiency and low distortion.

In order to attain suitable power levels, it is common practice to amplify modulated signals by what is known as Class C amplification for which the maximum theoretical efficiency is achievable, but is often accompanied by unacceptable distortion.

Complex modulated signals, such as Single Side Band (SSB) cannot be processed by conventional Class C amplitude modulated amplifiers.

An SSB signal is a special type of complex amplitude modulation which is used to conserve RF spectrum usage. In conventional AM modulation the structure of the signal in the spectrum consists of the RF carrier signal and two sidebands. The sidebands contain the information and extend above and below the carrier signal. The same information is contained in each sideband and the frequency bandwidth of each sideband is the same as the bandwidth of the information signal before it is modulated on the RF carrier. Thus a conventional AM RF signal occupies twice the bandwidth of the information signal. Since the carrier contains no information and all of the information is contained in each sideband it is possible to transmit all of the information by transmitting only one of the sidebands. This mode of transmission is called SSB. The advantage of SSB transmission is the fact that only one half of the RF bandwidth is required compared to conventional AM modulation. The generation of an SSB signal is complex and inherently inefficient. Therefore SSB signals are generated at low power levels and then amplified to the desired higher transmit power.

A major disadvantage of an SSB signal is that it must be processed through a linear or low distortion power amplifier to achieve the desired transmit power level. Such amplifiers are inherently low efficiency Class A or B types. The invention teaches the use of a new sophisticated modulation process which permits the use of high efficiency Class C amplifiers for such complex signals. The most obvious application for the invention at the present time is for the amplification of SSB signals, however, the scope of the invention is much more general and extends to a wider class of signals which may be amplified. The general class of signals covered are those which may be described as a signal which is a combination of both amplitude and frequency modulation which is referred to in this disclosure as complex modulation. The invention thus extends the upper limit of efficiency for complex signal amplification with the attending benefits of lower power consumption and less heat dissipation in the equipment. The invention is particularly important when used in equipment's which are battery powered or where power conservation is a premium. Such applications include, satellites, aircraft, mobile, hand-held cellular phones, portable devices, etc. The benefit of the higher efficiency permits a longer operating time for the same battery or power source, or a smaller battery or power source for the same operating time. Even in situations where power consumption is a secondary consideration the invention permits the use of lower cost components and lower heat dissipation capabilities and therefore permits a more economic and competitive design.

SUMMARY OF THE INVENTION

In general the invention applies to "complex modulation" in which the signals are combinations of both amplitude and frequency modulation. The invention extends the upper limit of efficiency for complex signal amplification with the attendant benefits of lower power consumption and less equipment heat dissipation. The invention is particularly important for equipment which is battery powered or where there is a premium on power conservation. Such equipments include satellites, aircraft, mobile, hand-held cellular phones, portable devices, etc.

In addition the higher efficiency afforded by the invention permits a longer operating time for the same battery or power source, or a smaller battery or power source for the same operating time. Even where power consumption is a secondary consideration, the invention permits the use of lower cost components with a lower heat dissipation requirement, and therefore permits a more economic and competitive design.

The encoding or modulation of complex signal information on a radio frequency carrier is usually carried out at low power levels of a few milliwatts. In general these complex information encoded signals, including digitally encoded signals, frequently are used at higher power levels. Typical utilizations include the transmission of the signals by a radiating antenna, driving a distribution cable, and similar applications which may require higher power levels than that at which the signal was originally produced.

Accordingly, it is an object of the invention to provide a modulation process which permits the use of high efficiency Class C amplifiers for complex signals, including single side-band signals. A related object of the invention is to facilitate high power, low distortion amplification of complex signals, including single side-band signals.

A further object of the invention is to facilitate the amplification of "complex modulation" in which the signals are combinations of both amplitude and frequency modulation.

A related object of the invention is to extend the upper limit of efficiency for complex signal amplification with the attendant benefits of lower power consumption and less equipment heat dissipation.

Still another object of the invention is to enhance the extended operability of equipment which is battery powered or where there is a premium on power conservation, including such equipment's as satellites, aircraft, mobile, hand-held cellular phones, and portable devices. A related object, in addition to achieving higher efficiencies, is to permit a longer operating time for the same battery or power source, or a smaller battery or power source for the same operating time.

Another object, even where power consumption is a secondary consideration, is to permit the use of lower cost components with a lower heat dissipation requirement, and therefore permit a more economic and competitive design.

DESCRIPTION OF THE DRAWINGS

Other aspects of the invention will become apparent after considering several illustrative embodiments, taken in conjunction with the drawings, in which.

DETAILED DESCRIPTION OF THE PREFERRED EMBODIMENTS

Figure 1:
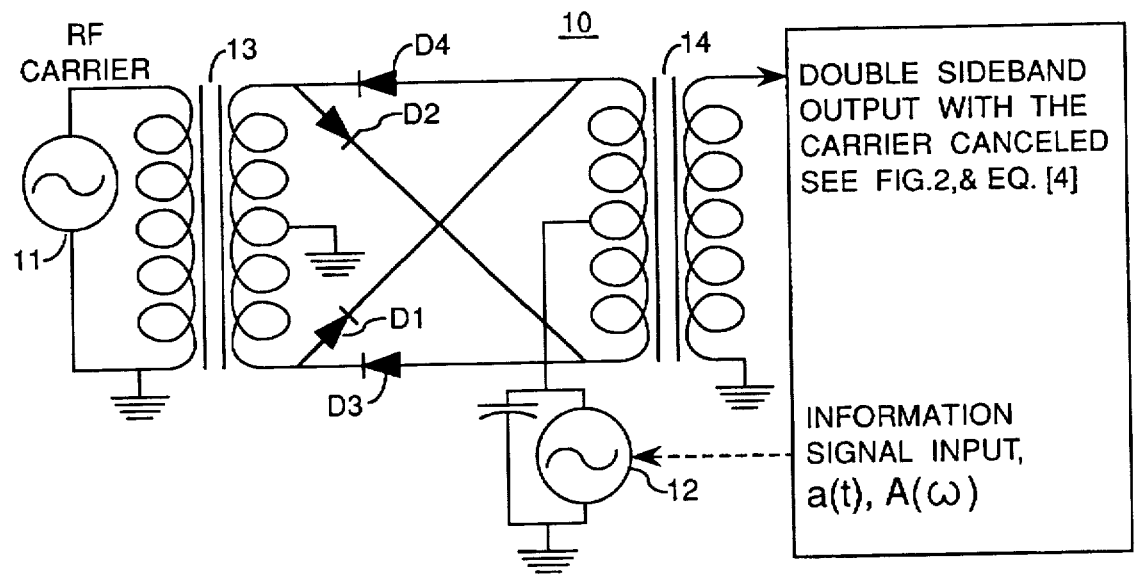
FIG. 1 is a diagram of a balanced modulator for generating single side-band signals.

In order to boost a relatively low power informational signal to a suitable power level for transmission, sometimes over a great distance, a low distortion amplifier is required in order to preserve the quality of the information contained in the signal. Such low distortion amplifiers are said to be "linear" in that they preserve the information and quality content of the signal.

Amplifiers are commonly constructed from vacuum tubes, transistors and various solid state devices, and are divided into "Classes" in accordance with their degree of linearity and efficiency. The most common Classes are A, B and C. There also is a Class AB which is a compromise between Classes A and B. The Class definition is based on the way in which the amplification device (vacuum tube, transistor, etc.) is "biased", i.e. set to its operating point. The Class also determines the maximum theoretical efficiency of the amplifier. Maximum theoretical and typically realizable efficiencies are shown in Table I, below.

TABLE I

| EFFICIENCIES OF CLASS A, B and C RF AMPLIFIERS | | |
|---|---|---|
| Amplifier Class | Maximum Theoretical | Typically Achieved |
| Class A | 25% (Resistive Load) | 15% |
| Class B | 78.5% | 40% |
| Class C | 100% | 85% |

The distortion introduced by the amplifier due to its non-linearity is also a very important consideration if it is to be used to amplify a complex signal. Class A amplifiers have the lowest distortion and the lowest efficiency. Class B amplifiers usually can be designed to have an acceptable level of distortion for most applications and have a higher efficiency than Class A. Therefore almost all applications requiring low distortion amplification of complex RF signals use Class B amplifiers. The Class C amplifier is the most efficient but extremely non-linear and cannot be used in general, according to existing modulation technology, to amplify complex signals. However, using existing technology Class C amplifiers are suitable for amplitude modulation applications, such as AM radio, and angle modulated applications such as FM (Frequency Modulation) and PM (Phase Modulation). In the AM case the RF carrier signal without the modulation is amplified to the desired power level and then the amplitude modulation is applied to the high power RF carrier.

Since the modulation or encoding takes place after the amplification the non-linearity or distortion of the Class C amplifier does not corrupt the resultant high power signal.

Class C amplifiers are also used for angle modulated signals, i.e. FM (Frequency Modulation) and PM (Phase Modulation). With angle modulation (FM & PM) the amplitude of the RF carrier signal is constant so the linearity of the Class C amplifier is not important. The modulation process involves encoding the information in the phase or frequency of the RF carrier which is not corrupted by the amplitude non-linearity of the Class C amplifier. An oscillator is angle modulated by the information signal and then amplified to the required high power level by a Class C amplifier. The amplitude of the output signal is constant so the non-linearity or distortion of the Class C amplifier does not corrupt the angle modulated signal. Note that the Class C modulation methods are not in use for AM, PM and FM signals, and cannot be applied to complex signals such as Single Side Band.

Another type of modulation is Single Side Band (SSB). This type of modulation suppresses one of the sidebands of an AM modulated signal which results in reduced frequency bandwidth in the Radio Frequency Spectrum. In some cases one of the sidebands as well as the carrier may be completely or partially reduced. Since all of the signal information is contained in each sideband there is no loss of the signal content and the benefit is the reduced bandwidth requirement in the RF spectrum. Special processing is required to generate or modulate the signal and to demodulate or recover the SSB signal. Many communications signals are truly SSB in that the carrier and one sideband are completely eliminated from the transmission. In US Television, one sideband and carrier are transmitted without reduction and the carrier and other side band is partially suppressed, the process is referred to as Vestigial Sideband Transmission.

SSB signals can be generated in a variety of ways. Two of the most commonest are illustrated in FIGS. 3 and 4, respectively for the balanced modulator filtering method and the balanced modulator phasing method.

Figure 3:
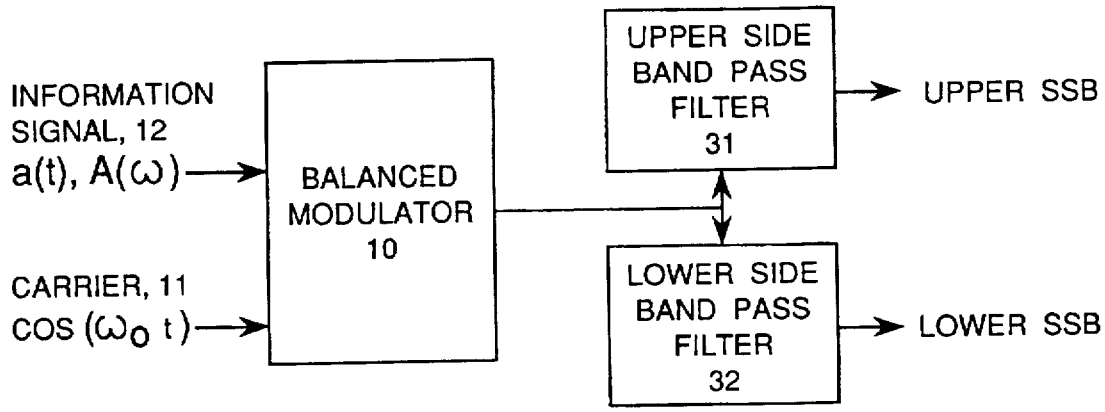
FIG. 3 is a diagram illustrating the formation of single side-band signals by filtering the balanced modulator output of FIG. 1.
Figure 4:
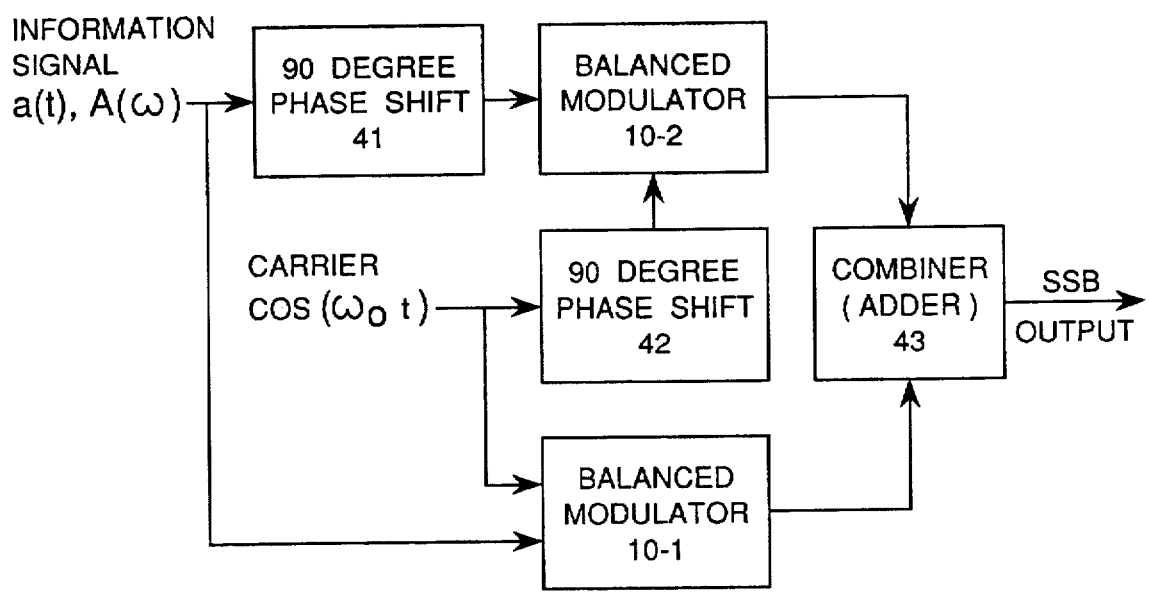
FIG. 4 is a diagram of phased balanced modulator network for generating single side-band signals without the need for the filtering of FIG. 3.

In the balanced modulator filtering method of FIGS. 1 and 3, a balanced modulator 10 accepts a carrier from a source 11 and an information signal from a source 12. The carrier is applied to a transformer 13 with a grounded center-tap 13-t and extends to an output transformer 14 through cross-coupled diodes D1 and D2 and direct coupled diodes D3 and D4. The information signal is applied across a capacitor C to the center-tap 14-t of the output transformer 14. The final output of the balanced modulator 10 is of two AM side bands above and below the carrier frequency. The carrier cancels and does not appear in the output.

Figure 2:
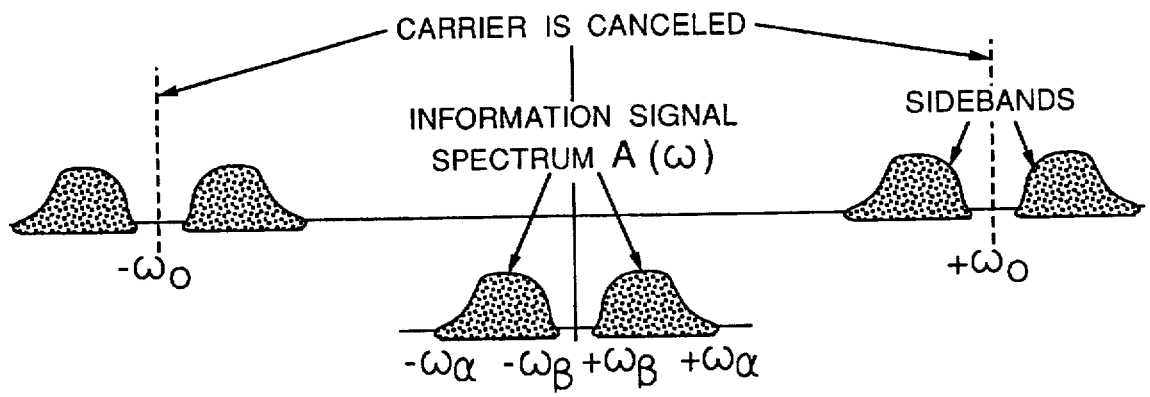
FIG. 2 is a graph of an illustrative information signal spectra and the associated modulated output spectra from a balanced modulator, such as that of FIG. 1.

The output spectrum of the balanced modulator 10 is shown in FIG. 2. The mathematical expression for a balanced modulator with an information signal a(t) modulating a carrier frequency $\omega_0$ is:

$$f(t) = a(t)\cos(\omega_o t) \quad [1]$$

The signal a(t) can be expressed as a Fourier series:

$$a(t) = a_1\cos(\omega_1 t + \Phi_1) + a_2\cos(2\omega_1 t + \Phi_2) + \ldots \quad [2]$$

or as the inverse Fourier Transform of the frequency spectrum, $A(\omega)$, i.e.:

$$a(t) = \frac{1}{2\pi} \int A(\omega) e^{j\omega t} dt \quad [3]$$

Using the trigonometric identity, $$\cos(\alpha)\cos(\beta) = \tfrac{1}{2}\cos(\alpha-\beta) + \tfrac{1}{2}\cos(\alpha+\beta) \quad [4]$$

and equations [1] and [2], or Fourier Transform theory, it can be shown that the output of the balanced modulator cancels the carrier frequency, $\omega_o$, and has upper and lower side bands with a frequency distribution and phase function determined by $a(t)$. That is the frequency distribution of the information signal, $a(t)$, which is $A(\omega)$, is shifted and relocated as a pair of sidebands above and below the carrier frequency. Filters are then used to select the upper sideband by filter 32 as shown in FIG. 3.

The balanced modulator phasing method for generating a SSB signal is shown in FIG. 4. The input information signal is input to one balanced modulator 10-1 and the same input signal shifted 90 degrees is input to a second balanced modulator 10-2 which also has the RF carrier input shifted 90 degrees. The two outputs from the balanced modulators are combined to form the SSB signal. The basis for this method is established by using single tone input information signals, $a(t) = \cos(\omega_1 t)$, and equation [4].

The phase shifted balanced modulator 10-2 signal is;

$$\cos(\omega_1 t + \pi/2)\cos(\omega_o t + \pi/2) = \tfrac{1}{2}\cos((\omega_1 - \omega_0)t) - \tfrac{1}{2}\cos((\omega_1 + \omega_0)t) \quad [5]$$

The non-phase shifted balanced modulator 10-1 signal is;

$$\cos(\omega_1 t)\cos(\omega_o t) = \tfrac{1}{2}\cos((\omega_1 - \omega_0)t) + \tfrac{1}{2}\cos((\omega_1 + \omega_0))t) \quad [6]$$

When [5] and [6] are combined or added the result is;

$$[5]+[6] = \cos((\omega_1 - \omega_0)t) \quad [7]$$

which is the input tone, $\omega_1$, shifted down from the carrier, or the lower SSB signal.

If the phase shift is changed to $+\pi/2$, then the combined output will shifted up by $\omega_1$ from the carrier or the upper SSB signal.

The results of both the filtering and phasing methods are the same in terms of generating a SSB signal.

The complexity and inefficiency of generating an SSB signal demands that it be carried out at a low power level and than amplified to the desired high power for transmission. The amplification process must not distort the signal. Therefore a linear/low distortion amplifier must be used. Unfortunately, such amplifiers are also of low efficiency, as explained above.

Information is transmitted using electromagnetic radiation by encoding or modulating the information signal on a higher frequency carrier signal and then transmitting the result by radiation from an antenna, or through a wire, cable, including a fiber optic cable, or waveguide.

The information signal is "narrow band", by having a frequency bandwidth much less than that of the carrier upon which the information signal is to be encoded or modulated. The information signal could be audio speech and/or music, a TV video and/or audio, a pulse coded or digitized signal, or any information signal which has a bandwidth less than the carrier upon which the signal is to be modulated or encoded.

The invention provides a process by which a Class "C" amplifier can be used to amplify complex modulated signals. This permits the use of the high efficiency class "C" amplifiers in place of lower efficiency class "A" or "B" linear amplifiers which are presently required to accomplish the same end.

Figure 5:
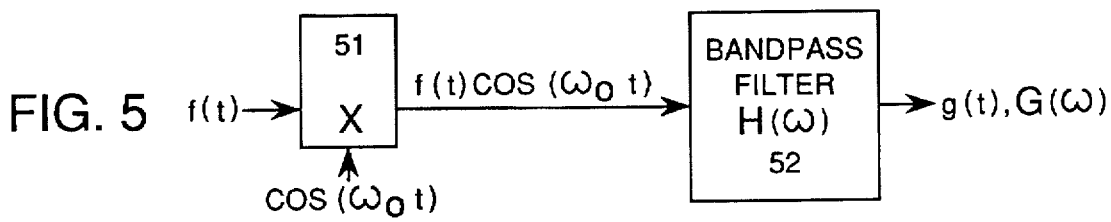
FIG. 5 is a diagram of a general modulation process for explaining the invention.

The general modulation process applicable to the invention is shown in FIG. 5, as explained in terms of Fourier transforms. Functions of the form $z(t)$ and $Z(\omega)$ constitute Fourier transform pairs which link the time domain $z(t)$ and the frequency domain $Z(\omega)$.

The input time domain information signal $f(t)$, (audio, video, digital, etc.), is multiplied by the carrier signal, $\cos(\omega_0 t)$. The result, $f(t) \cos(\omega_0 t)$, is processed through a band-pass filter, with the complex frequency transfer function $H(\omega)$. The in phase and quadrature components of the low frequency envelope of $H(\omega)$ are $Hp(\omega)$ and $Hq(\omega)$. The time domain responses of $Hp(\omega)$ and $Hq(\omega)$ to $f(t)$ are $g_p(t)$ and $g_q(t)$. The output of the process is given by:

$$g(t) = \sqrt{g_p(t)^2 + g_q(t)^2} \; \cos[\omega_o t - \tan^{-1}(g_p(t)/g_q(t))] \quad [8]$$

Defining the terms in equation [8] as:

$$a(t) = \sqrt{g_p(t)^2 + g_q(t)^2} \;\; , \text{ and} \quad [9]$$

$$\phi(t) = \tan^{-1}(g_p(t)/g_q(t)) \quad [10]$$

Equation [8] now reads:

$$g(t) = a(t)\cos[\omega_o t - \phi(t)] \quad [8a]$$

The invention is based on recognizing the following facts in relation to [8a];

(a) The only restrictions on the band-pass filter are that it is narrow band, i.e. the band width is much less than the center frequency; and $H(-\omega) = H^*(\omega)$, i.e. the function at $-\omega$ is equal to the complex conjugate of the function at $\omega$. This is not a restrictive condition in that all passive filters are of this type.

Figure 10:
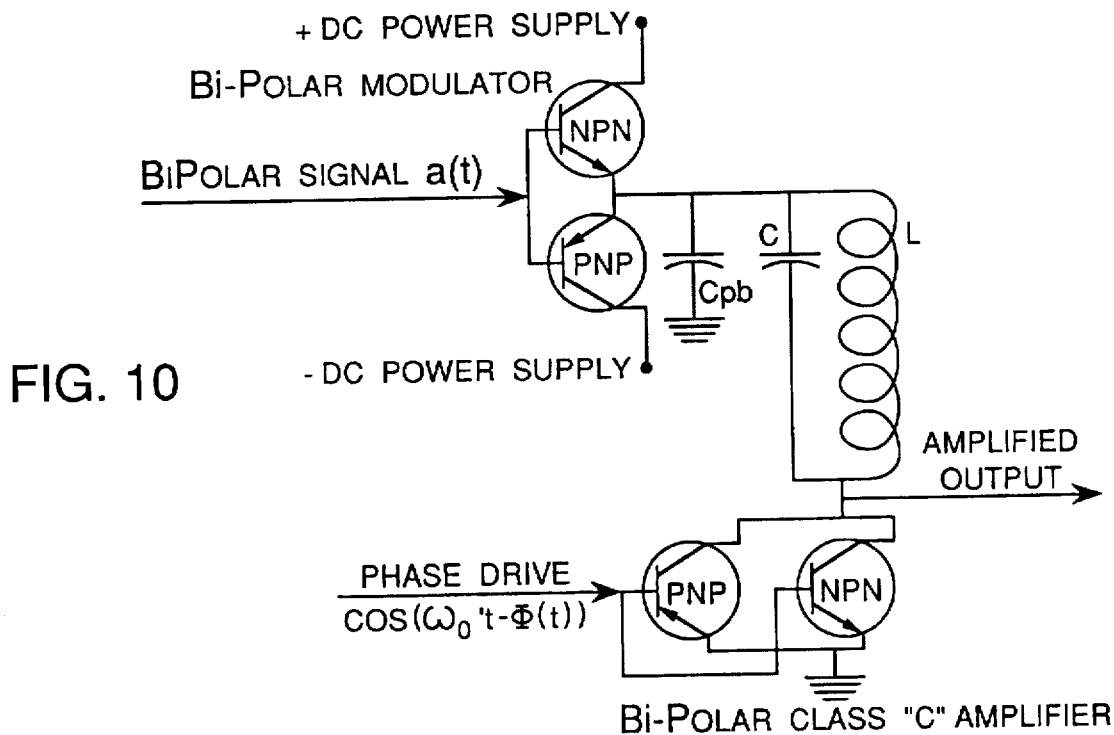

(b) $g(t)$ is the general expression for the result of the modulation process shown in FIG. 10.

(c) $g(t)$ is a carrier at frequency $\omega_o$ which is simultaneously amplitude modulated by $a(t)$ and angle or phase modulated by $\phi(t)$.

(d) Both the amplitude and phase modulation can be processed simultaneously by a Class C amplifier.

(e) Equation [8a] also describes conventional AM and FM/PM signals as special cases. The AM case results when $a(t) = 1 + f(t)$ and $\phi(t) = $ constant. The FM case results when $a(t) = $ constant, and $\phi(t) = f(t)t \, \Delta\omega/\omega_o$. The PM case results when $a(t) = $ constant, and $\phi(t) = f(t) f_{MAX}$. In all cases $f(t)$ is normalized to unity.

(f) By choosing the Filter to select either the upper or lower sideband the special case of the SSB modulation process can be realized. If the filter characteristic is chosen to attenuate one sideband, some of the carrier and most of the other sideband then the process is equivalent to Vestigial Sideband operation.

The invention applies both amplitude modulation (AM) and angle modulation (PM or FM) simultaneously, and consistent with the quantities $a(t)$ and $\phi(t)$ as defined in equations [8] through [10] for the efficiently amplifying, without significant distortion, the RF signal $g(t)$, as defined by equation [7], to a higher level $A \, g(t)$ using a class "C" amplifier.

A is a constant greater than one. Essential to the proper functioning of the invention is the generation of the drive signals, a(t) and $\cos[\omega_o t - \phi(t)]$, from the data/information signal f(t). There are two methods of approach for the implementation of these two functions. First there is the analog method shown in FIG. 6 which derives a(t) and $\cos[w_o t - f(t)]$ from a conventionally generated low level g(t). Second there is a digital or computational approach shown in FIG. 7.

Figure 6:
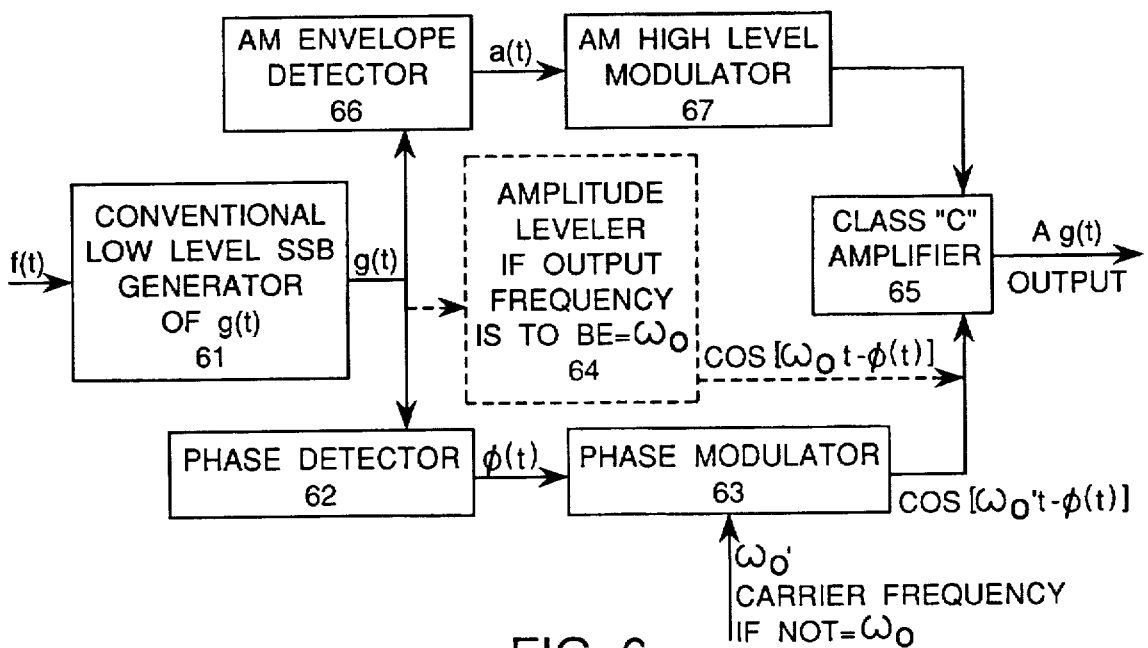
FIG. 6 is a block diagram of an analog implementation of the invention.

In FIG. 6 the low power level information input signal f(t) is used to generate, by conventional, means a low level Complex Signal (such as an SSB signal) $g(t) = a(t) \cos[\omega_o t - f(t)]$. The conventional means in the case of SSB includes the balanced modulator filter method shown in FIG. 3 or the balanced modulator phasing method shown in FIG. 4. Two choices are available for the processing of g(t). If the output transmitter carrier frequency is to be shifted from $\omega_o$ to $\omega_o'$ then g(t) is phase detected and phase modulated on the new carrier frequency $\omega_o'$ as shown by the solid line diagram in FIG. 6. If the output carrier is to be the same as that at which g(t) was generated, i.e. $\omega_o$, then the signal is processed through only an amplitude leveler 64 and then provided as drive to the Class "C" amplifier, as shown by the dotted line diagram in FIG. 6.

If the carrier frequency is to be shifted to $\omega_o'$ then complex low level signal g(t) is both AM envelope detected and phase detected to obtain the a(t) and $\phi(t)$ signals. The a(t) signal drives an AM Modulator which applies high level modulation to the Class "C" Amplifier Stage. The $\phi(t)$ signal is input to a phase modulator 63 operating at the shifted carrier frequency of $\omega_o'$. The output of the phase modulator 63 is the signal $\cos[\omega_o' t - \phi(t)]$ which then drives the Class "C" Amplifier Stage. The resultant output of the Class "C" amplifier stage is a replication of the input signal g(t) amplified to the level A g(t) but shifted to a carrier of $\omega_o'$. If the output frequency is not to be shifted then g(t) is AM detected to obtain a(t) and the phase demodulator/modulator in the solid line diagram is not used. AM envelope detectors, high level AM modulators, amplitude levelers, phase detectors, phase modulators and Class "C" amplifier stages are well established devices.

Figure 7:
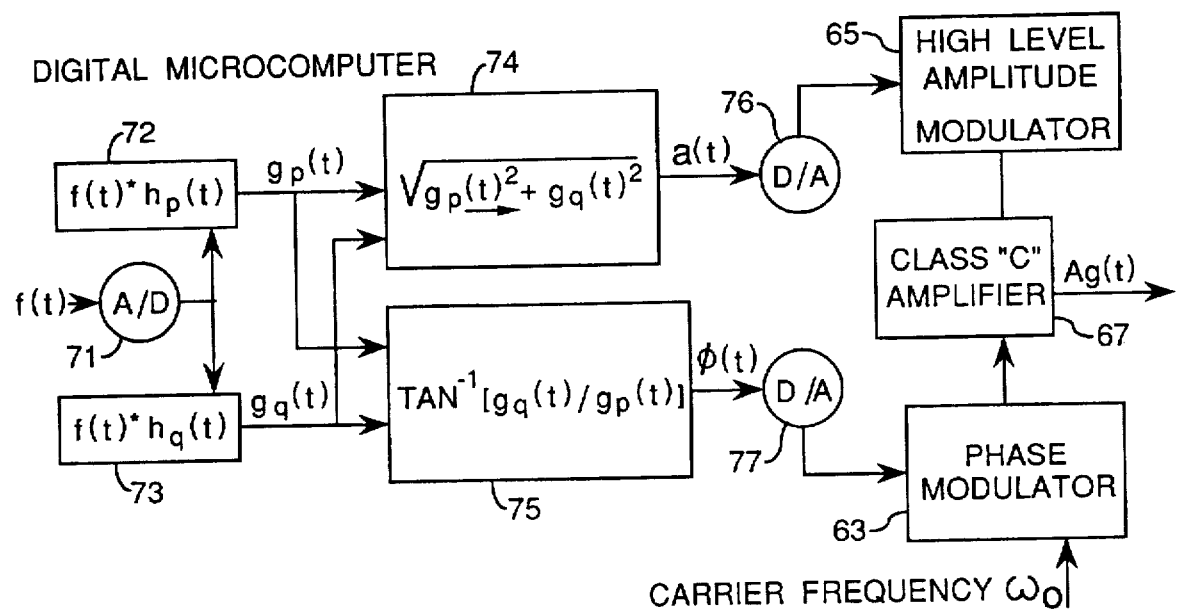
FIG. 7 is a block diagram of a digital implementation of the invention using digital computational signal processing.

FIG. 7 shows the block diagram of the digital or computational implementation of the invention. The input signal, f(t), is digitized as are the in-phase and quadrature components of the filter characteristics, $Hp(\omega)$, $h_p(t)$ and $Hq(\omega)$, $h_q(t)$. The variables $g_p(t)$ and $g_q(t)$ are the responses of $H_p(\omega)$ and $H_q(\omega)$ to f(t) and can be computed as the convolution integrals:

$$g_p(t) = f(t) * h_p(t) = \int f(y) h_p(t-y) dy \quad [11]$$

$$g_p(t) = f(t) * h_q(t) = \int f(y) h_q(t-y) dy \quad [12]$$

Equations [11] and [12] are readily computed and processed, as indicated in FIG. 7, by digital computational methods using a customized digital microcomputer. The function boxes shown within the "Micro Computer" area in FIG. 7 indicate the digital computations which are carried out to process the input, f(t), to achieve the required drive signals for the Class "C" amplifier.

In the digital implementation 70 of the invention shown in FIG. 7, the input signal f(t) is digitized by an analog to digital converter 71 and separated into in-phase and quadrature filter characteristic components in respective units 72 and 73.

The quantities $g_p$ (t) and $g_q$ (t) of equations (11) and (12) are readily determined by digital computer, and are used to obtain a(t) by taking the square root of the sums of the squares of the in-phase and quadrature components $g_p$ (t) and $g_q$ (t) in the unit 74.

Figure 8:
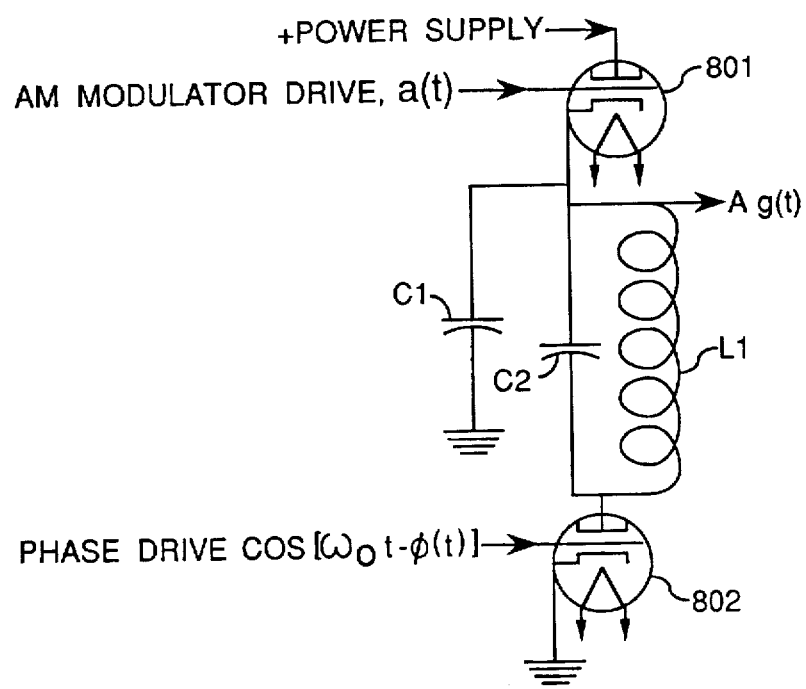
FIGS. 8–10 are a wiring diagrams of representative high level amplitude and phase modulators and a Class "C" amplifier stage for the implementations of FIGS. 6 and 7.

The quantities $g_p$ (t) and $g_q$ (t) are used to yield the desired angle of modulation $\phi(t)$ in the unit 75. The units 72–75 also can represent digital computation function boxes that are shown within the "Microcomputer" area of FIG. 7, indicating the digital computations which are carried out to process the input f(t) to achieve the required drive signals for the Class C amplifier. Since the a(t) and $\phi(t)$ signals within the microprocessor 70-m are in digital form, they are converted to analog form in respective digital to analog converters 76 and 77. Once in analog form, the signals of FIG. 7 are further processed in the modulators 63 and 67 and in the amplifier 65 in the same fashion as for the analog system 60 of FIG. 6. A simplified Class C amplifier is shown in FIG. 8, with the modulated a(t) signal and the modulated phase drive applied to respective grids of active devices 801 and 802, which are shown as vacuum tubes, but other devices such as transistors could be used as well. There also are numerous other configurations for the Class C amplifier and the AM high level modulator 65 shown in FIG. 7.

The invention permits Class C amplifiers to process complex modulation signals, such as SSB, at high power levels with low distortion and high efficiency. Previously, to obtain low distortion it was necessary to use Class B linear amplification at lower efficiency. The increase in efficiency afforded by the invention is significant because it occurs in the output or high power stage of amplification. The approximate increase in efficiency is from, about 40% for Class B to about 85% for Class C. As a result, power consumption for otherwise equivalent systems will be reduced about 50%. Consequently, in the case of a battery-operated SSB transmitter, a 1 watt output requires about 2.5 watts of input power for Class B operation, but only 1.2 watts of input power if Class C operation is used. The result is an improvement in battery size and life. Since there is reduced heat dissipation, the ratings cost and size of components is significantly less, so that the Class C design of the invention is more economic, competitive and smaller than its Class B counterpart. of input power for Class B operation, but only 1.2 watts of input power if Class C operation is used. The result is an improvement in battery size and life. Since there is reduced heat dissipation, the ratings cost and size of components is significantly less, so that the Class C design of the invention is more economic, competitive and smaller than its Class B counterpart.

FIG. 8 is a wiring diagram of representative high level amplitude and phase modulators and a Class "C" amplifier stage for the implementations of FIGS. 6 and 7. The simplified diagram shown in FIG. 8 illustrates in principle the implementation of the invention; however, there are important details which must be included. The AM modulator shown in FIG. 8 is of the conventional prior art implementation, and can accomodate and process a(t) drive signals, which are only of the positive going (unipolar) type. In general, a(t) is a bi-polar signal, and modifications of the AM modulation process and hardware must be made to implement the invention. There are two methods for accomplishing this. The form of the signal to be amplified is given by equation 8a.

$$g(t) = a(t) \cos[\omega_o t - \Phi(t)] \quad (8a)$$

Figure 9:
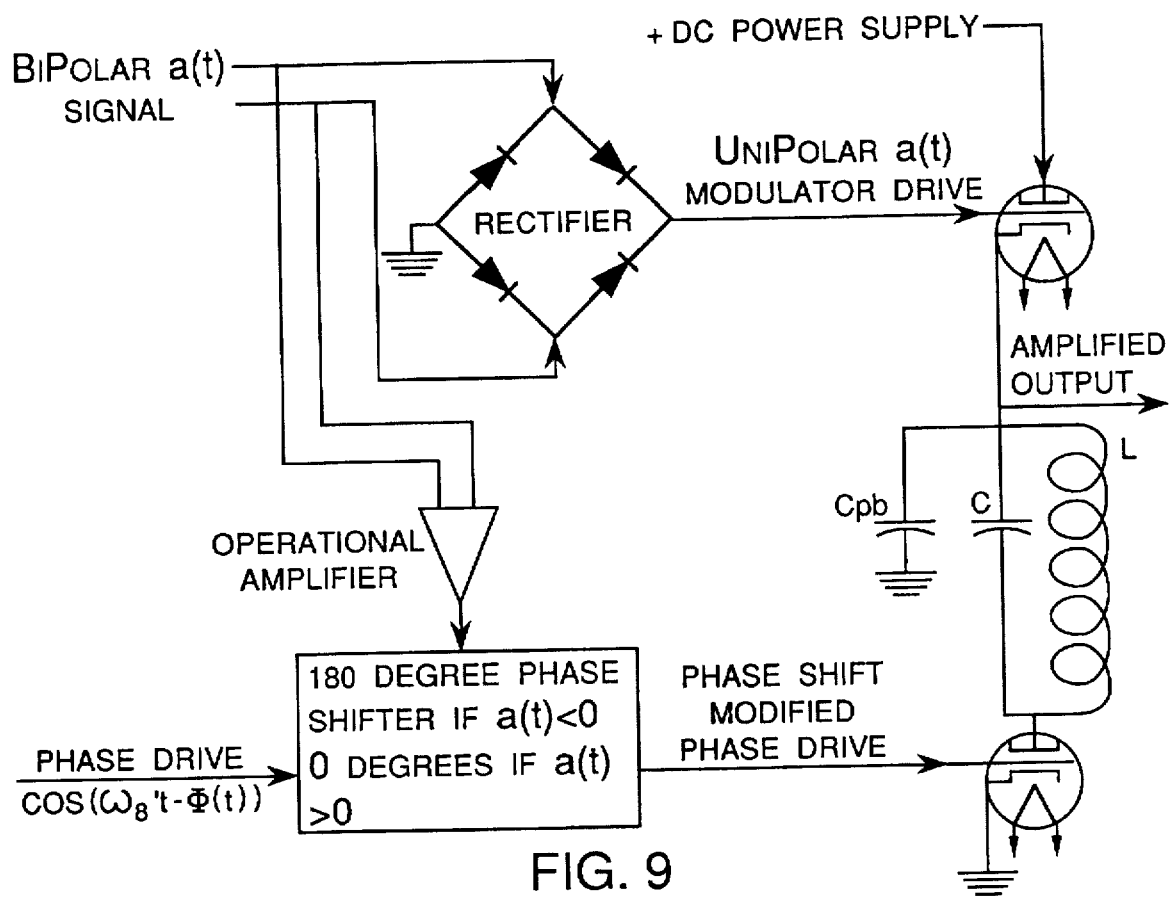

The first method for adapting the invention to the class "C" amplifier is the rectification and phase shift method, and is accomplished as follows. When the term a (t) takes negative values, it is eqiuvalent to using the absolute value of a(t) and shifting the phase of the cos $[\omega_0 t - \Phi(t)]$ term by 180 degrees (or $+/-\pi$ radians). This is so by the well known trigonometric identity, $\cos(A) = -\cos (A=/-180°)$. The phase may be shifted either plus or minus with the same result. Based on this fact, the implementation (simplified) becomes that shown in FIG. 9. The a(t) input which is in general a bi-polar signal is rectified then applied as a uni-polar signal to the AM modulator. In FIG. 9 the modulator is shown as a vacuum tube; but transistors can also be used. The a(t) signal is also passed through an operational amplifier (op amp) the output of which drives a 180 degree phase shifter. The phase shifter shifts the phase of the cos $[\omega_0 t - \Phi(t)]$ signal passing through it by 180 degrees when the a(t) signal is less than zero, and by zero degrees when the a(t) is greater than zero. The output of the phase shifter is then provided as the phase drive signal to the class "C" amplifier. The amplifier is shown as a vacuum tube; but transistors can also be used. The capacitor Cpb is an RF by-pass, capacitorC and inductor L form the tuned RF circuit of the amplifier. The use of these components is well known to those skilled in the art.

The second method of adapting the invention to a class "C" amplifier is by the use of a bi-polar class "C" amplifier-modulator, which is shown in Fifure 10. The bi-polar version of the class "C" amplifier consists of a pair of complementary amplifiers, one each PNP and NPN. When the modulation is positive, the NPN transistor functions, and when the modulation is negative, the PNP transistor functions. Thus the amplifier functions when powered or modulated with either a plus or minus polarity. The bi-polar signal a(t) may be aplied to such a class "C" amplifier if the level of a(t) is high enough; or as shown, passed through a bi-polar modulation amplifier. The phase drive signal cos $[\omega_0 t - \Phi(t)]$, is applied directly as a base drive to the complementary pair of transistors in the class "C" amplifier. The circuits in FIGS. 9 and 10 are simplified, but show the essential features to apply the invention.

While the term "radio" has been used from time to time in the above detailed description, it use in the context of the invention includes all electromagnetic radiation transmissions of information or other complex signals such as Television, digitally encoded information, RADAR, etc., as well as what is commonly referred to as radio.

The foregoing detailed description is illustrative only, and other adaptations uses and implementations of the invention will be readily apparent to those of ordinary skill in the art.

What is claimed:

1. Apparatus for amplifying a modulated signal, comprising:

means for producing an amplitude modulation envelope of an information signal;

means for modulating said amplitude modulated envelope;

means for angle modulating said information signal; and means for amplifying the modulation of said modulated envelope and the angle modulated signal.

2. Apparatus as defined in claim 1 wherein said means for producing an amplitude modulation envelope of said information signal includes means for deriving a carrier suppressed modulated signal which is simultaneously amplitude and angle modulated.

3. Apparatus as defined in claim 1 wherein said amplitude modulation envelope is the square root of the sums of the squares of the in-phase and quadrature components $g_p$ (t) and $g_q$ (t) of a carrier suppressed modulated signal which is simultaneously amplitude and angle modulated by said information signal.

4. Apparatus as defined in claim 1 further including means for modulating the phase component of said carrier suppressed modulated signal using a frequency different than that of said carrier, and applying the modulated phase component to the amplifying means, thereby changing the output frequency of said carrier.

5. Apparatus as defined in claim 1 wherein said means for angle modulating said information signal is at an input carrier frequency, thereby maintaining the same input and output carrier frequencies.

6. Apparatus as defined in claim 5 further including means for leveling the amplitude of the angle modulated information signal.

7. Apparatus as defined in claim 1 wherein said modulation of said modulated envelope and said angle modulated signal are processed simultaneously by the amplifying means.

8. Apparatus as defined in claim 7 wherein said amplifying means is non-linear.

9. Apparatus as defined in claim 8 wherein the nonlinear amplifying means is in Class C operation.

10. Apparatus for producing an amplified modulated signal comprising:

means for deriving an amplitude varying drive signal from an information signal;

means for deriving an angle modulated signal from said information signal;

means for modulating said amplitude varying drive signal; and means for simultaneously amplifying the modulated amplitude varying drive signal and said angle modulated signal; thereby to produce said amplified modulated signal.

11. Apparatus as defined in claim 10 wherein said amplitude varying drive signal is represented digitally.

12. Apparatus as defined in claim 10 wherein the angle of said angle modulated signal is represented digitally.

13. Apparatus as defined in claim 10 wherein said varying amplitude is represented by an analog envelope.

14. Apparatus as defined in claim 10 wherein said angle is represented by an analog value.

15. The method of amplifying a modulated signal, comprising the steps of:

(a) producing an amplitude modulation envelope of an information signal;

(b) modulating said amplitude modulated envelope;

(c) angle modulating said information signal; and (d) amplifying the modulation of said modulated envelope and the angle modulated signal.

16. The method as defined in claim 15 wherein the step of producing an amplitude modulation envelope of said information signal includes deriving a carrier suppressed modulated signal which is simultaneously amplitude and angle modulated.

17. The method as defined in claim 15 wherein said amplitude modulation envelope is obtained by taking the square root of signals representing the sums of the squares of the in-phase and quadrature components $g_p(t)$ and $g_q(t)$ of p a carrier suppressed modulated signal which is simultaneously amplitude and angle modulated by said information signal.

18. The method as defined in claim 15 further including modulating the phase component of said carrier suppressed modulated signal using a frequency different than that of said carrier, and applying the modulated phase component to the amplifying means; thereby to change the output frequency of said carrier.

19. The method as defined in claim 15 wherein the angle modulation of said information signal is at an input carrier frequency, thereby maintaining the same input and output carrier frequencies.

20. The method as defined in claim 16 wherein the angle modulation of said information signal is at an input carrier frequency, thereby maintaining the same input and output carrier frequencies.

* * * * *